United States Patent
Hsu et al.

(10) Patent No.: US 8,123,965 B2
(45) Date of Patent: Feb. 28, 2012

(54) INTERCONNECT STRUCTURE WITH STRESS BUFFERING ABILITY AND THE MANUFACTURING METHOD THEREOF

(75) Inventors: Yung-Yu Hsu, Hsinchu (TW); Shyi-Ching Liau, Hsinchu (TW); Ra-Min Tain, Taipei County (TW); Jr-Yuan Jeng, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 761 days.

(21) Appl. No.: 12/170,272

(22) Filed: Jul. 9, 2008

(65) Prior Publication Data

US 2008/0264899 A1 Oct. 30, 2008

Related U.S. Application Data

(62) Division of application No. 11/473,271, filed on Jun. 23, 2006, now Pat. No. 7,586,187.

(30) Foreign Application Priority Data

Mar. 31, 2006 (TW) ................................ 95111380 A

(51) Int. Cl.
B44C 1/22 (2006.01)
C25F 3/00 (2006.01)
C03C 25/68 (2006.01)

(52) U.S. Cl. ................. 216/37; 216/18; 216/39; 216/41; 216/52; 216/83

(58) Field of Classification Search ............... 216/18, 216/37, 39, 41, 52, 83

See application file for complete search history.

(56) References Cited

U.S. PATENT DOCUMENTS

| | | | |
|---|---|---|---|
| 5,783,465 A | 7/1998 | Canning et al. | |
| 6,202,298 B1 * | 3/2001 | Smith | 29/840 |
| 6,307,159 B1 | 10/2001 | Soejima et al. | |
| 6,555,759 B2 | 4/2003 | Tzanavaras et al. | |
| 6,710,446 B2 | 3/2004 | Nagai et al. | |
| 6,767,818 B1 | 7/2004 | Chang et al. | |
| 6,774,315 B1 * | 8/2004 | Pierson et al. | 174/261 |
| 6,791,195 B2 | 9/2004 | Urushima | |
| 6,818,544 B2 | 11/2004 | Eichelberger et al. | |
| 6,884,313 B2 * | 4/2005 | Liu et al. | 156/292 |
| 7,105,918 B2 * | 9/2006 | Lee | 257/698 |
| 7,892,441 B2 * | 2/2011 | Pai | 216/18 |
| 2005/0003658 A1 * | 1/2005 | Kirby | 438/641 |
| 2009/0121346 A1 * | 5/2009 | Wachtler | 257/724 |
| 2009/0217515 A1 * | 9/2009 | Aoyama et al. | 29/832 |

FOREIGN PATENT DOCUMENTS

TW 589727 I 6/1992

(Continued)

Primary Examiner — Lan Vinh
Assistant Examiner — Christopher Remavege
(74) Attorney, Agent, or Firm — Birch, Stewart, Kolasch & Birch, LLP

(57) ABSTRACT

An interconnect structure with stress buffering ability is disclosed, which comprises: a first surface, connected to a device selected form the group consisting of a substrate and an electronic device; a second surface, connected to a device selected form the group consisting of the substrate and the electronic device; a supporting part, sandwiched between and interconnecting the first and the second surfaces while enabling the areas of the two ends of the supporting part to be small than those of the first and the second surfaces in respective; and a buffer, arranged surrounding the supporting part for absorbing and buffering stresses.

6 Claims, 7 Drawing Sheets

FOREIGN PATENT DOCUMENTS

| | | |
|---|---|---|
| TW | 225381 I | 12/1992 |
| TW | 242856 I | 2/1993 |
| TW | 00511267 B | 11/2002 |
| TW | 511267 B | 11/2002 |
| TW | 225701 I | 12/2004 |

* cited by examiner

INTERCONNECT STRUCTURE WITH STRESS BUFFERING ABILITY AND THE MANUFACTURING METHOD THEREOF

This application is a Divisional of application Ser. No. 11/473,271, filed on Jun. 23, 2006, now U.S. Pat. No. 7,586,187, and for which priority is claimed under 35 U.S.C. §120; and this application claims priority of application No. 095111380 filed in Taiwan, R.O.C. on Mar. 31, 2006 under 35 U.S.C. §119; the entire contents of all are hereby incorporated by reference.

FIELD OF INVENTION

The present invention relates to a micro compliant bump and method of manufacturing the same, and more particularly, to a novel interconnect structure with buffering ability capable of electrically interconnecting and absorbing stress between electrical devices, by which not only the bonding wires and electrical devices can be effectively protected in a packaging process, but also a buffering structure with high reliability can be achieve by a simple manufacturing process.

BACKGROUND OF THE INVENTION

As the semiconductor technology continues to advance, electronic products are becoming thinner, lighter, shorter and smaller while the IC chips used in those electronic products are multifunction high I/O chips with high clock rate. Moreover, in the push to faster speed and lower power consumption, IC chips are continued to be scaled beyond the 90 nm node while materials of low-dielectric constant, i.e. low-K material, are used to fabricate internal wiring interconnects. The fabrication of low-k interconnects requires novel materials and processes, which give rise to technical bottlenecks in the packaging of integrated circuits, such as how to select a proper material for fabricating an IC, how to reduce stress and deformation resulting from thermal expansion mismatches between dissimilar materials during a packaging process, and so on.

As consumer continues to ask for, and purchase, smaller and smaller units, these demands eventually translate into more efficient designs in the packaging, such as BGA, Fine Pitch, Flip-Chip, CSP, etc., whereas, in general, small Pb—Sn solder bumps are built up directly on the pads of an IC chip while the IC chip is inverted and solder to pads on a circuit board. However, the aforesaid packaging technologies will cause the IC chip to subject to relative high thermal-induced stresses while inducing shear stresses to be generated between the IC chip and the circuit board. The stresses might cause the IC chip to be damaged or broken that not only will cause the device reliability to be reduced, but also have adverse effect on production yield. Furthermore, in order to integrate the low-K materials into advanced 90 nm interconnect processes, low-k materials need to meet a demanding list of electrical, mechanical, chemical and thermal integrity requirements to deliver the desired electrical performance, to enable compatibility with fabrication in module operation for high-volume manufacturing at high yield, and to ensure high device reliability in end use. However, the low-K material is generally poor to withstand thermal-induced stresses, so that it is important to have a manufacturing process of low stress.

The flip-chip bonding is the most commonly used and promising technique to meet the requirements for high-density packaging and high-frequency performance, which usually forms a layer of underfill encapsulating the solder bumps interconnecting a chip and a substrate for overcoming cracking caused by the thermal-induced stresses. In many cases, however, solder bumps are formed on the chip side, and then, many additional processes are needed in order to fabricate bumps on the integrated circuit (IC) chip. The additional processes lead to a decrease in chip production yield and an increase in production cost. Moreover, the Pb-based solder bump technique is problematic with respect to the environment. Recently, a variety of new flip-chip connecting methods have been developed. One of which is disclosed in U.S. Pat. No. 5,783,465, entitled "COMPLIANT BUMP TECHNOLOGY", which describes an interconnection technique using compliant metal coated photodefined polymer bumps for mounting and interconnecting component assemblies on substrates such as glass, printed wiring boards, etc. The polymer chosen for the bump structure has relatively low Ts and the polymer bump is metallized in a way that substantially encapsulates the polymer, i.e. the polymer is wrapped in a conductive film. However, this so-called under-fill process requires time consuming steps of deposition and vacuum flow followed by curing. Second, if a chip is bad it cannot be removed once the under-fill has been applied and cured. Another such method is used in U.S. Pat. No. 6,818,544 and U.S. Pat. No. 6,555,759, which employ a compliant photo patternable polymer as the core of an I/O bump so as to provide sufficient compliance to absorb the expansion differential between two electrical devices interconnecting thereby. However, many additional processes are needed in order to fabricate bumps on the integrated circuit (IC) chip by the forgoing method that lead to a decrease in chip production yield and an increase in production cost.

To address the deficiencies of the above processes, presented herein are a novel structures and method of fabrication which are capable of buffering the strain on the interconnection bumps between a first and second electrical devices.

SUMMARY OF THE INVENTION

In view of the disadvantages of prior art, the primary object of the present invention is to provide an interconnect structure with buffering ability and method of manufacturing the same, capable of electrically interconnecting and absorbing stress between electrical devices, by which not only the bonding wires and electrical devices can be effectively protected in a packaging process, but also a buffering structure with high reliability can be achieve by a simple manufacturing process.

To achieve the above object, the present invention provides an interconnect structure with buffering ability, comprising: a first surface, connected to a device selected form the group consisting of a substrate and an electronic device; a second surface, connected to a device selected form the group consisting of the substrate and the electronic device; a supporting part, sandwiched between and interconnecting the first and the second surfaces while enabling the areas of the two ends of the supporting part to be small than those of the first and the second surfaces in respective; and a buffer, arranged surrounding and encapsulating the supporting part for absorbing and buffering stresses.

Preferably, the substrate is electrically connected to the electrical device by the use of the component assembly formed of the first surface, the second surface and the supporting part.

Preferably, there can be more than one supporting parts, sandwiched between and interconnecting the first and the second surfaces.

Other aspects and advantages of the present invention will become apparent from the following detailed description,

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 1:
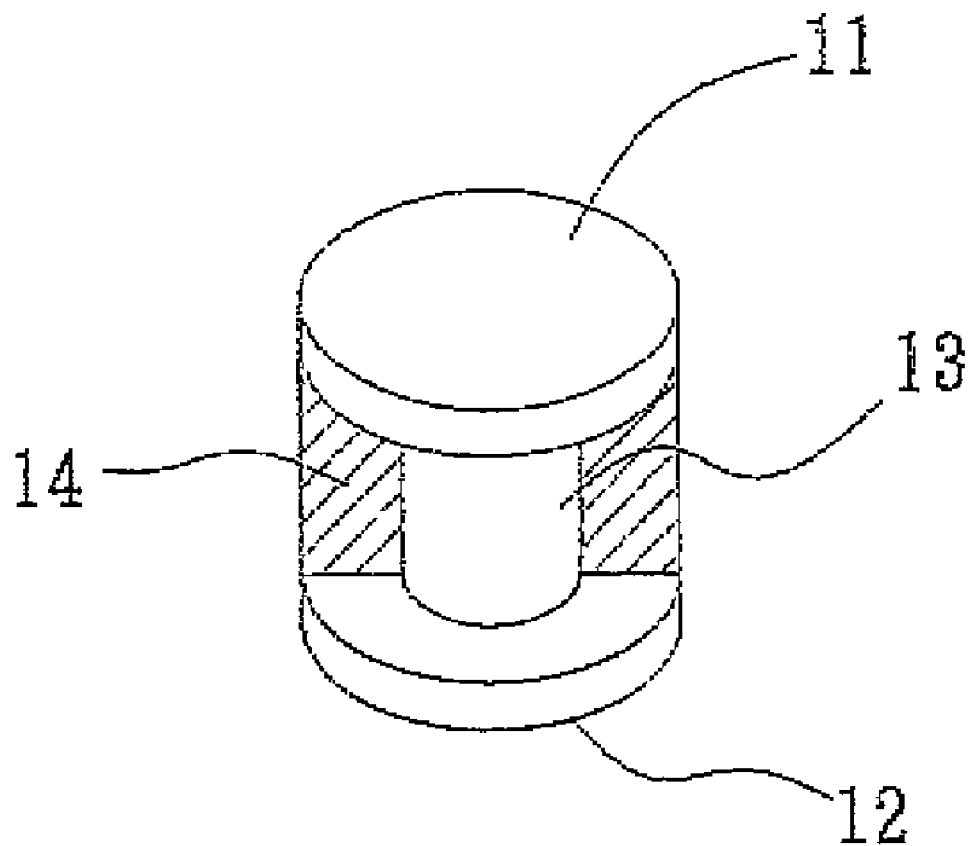
FIG. 1 is a schematic view of an interconnect structure with buffering ability according to a first embodiment of the invention.

Please refer to FIG. 1, which is a sectional view of an interconnect structure with buffering ability according to a first embodiment of the invention. The interconnect structure shown in FIG. 1 is comprised of: a first surface 11, connected to a device selected form the group consisting of a substrate and an electronic device while the electronic device can be a device selected from the group consisting of any common chips and any integrated circuits of surface-mount technology (SMT); a second surface 12, connected to a device selected form the group consisting of the substrate and the electronic device; a supporting part 13, being a pillar in this embodiment, sandwiched between and interconnecting the first and the second surfaces 11, 12 while enabling the areas of the two ends of the supporting part 13 to be small than those of the first and the second surfaces 11, 12 in respective; and a buffer 14, arranged surrounding the supporting part 13, made of a low-K polymer, for absorbing and buffering stresses; wherein, the substrate is electrically connected to the electrical device by the use of the component assembly formed of the first surface 11, the second surface 12 and the supporting part 13; and the low-K polymer can be a polyimide (PI) that is arranged to surround the supporting part 13 by a means of wrapping or filling.

Figure 2:
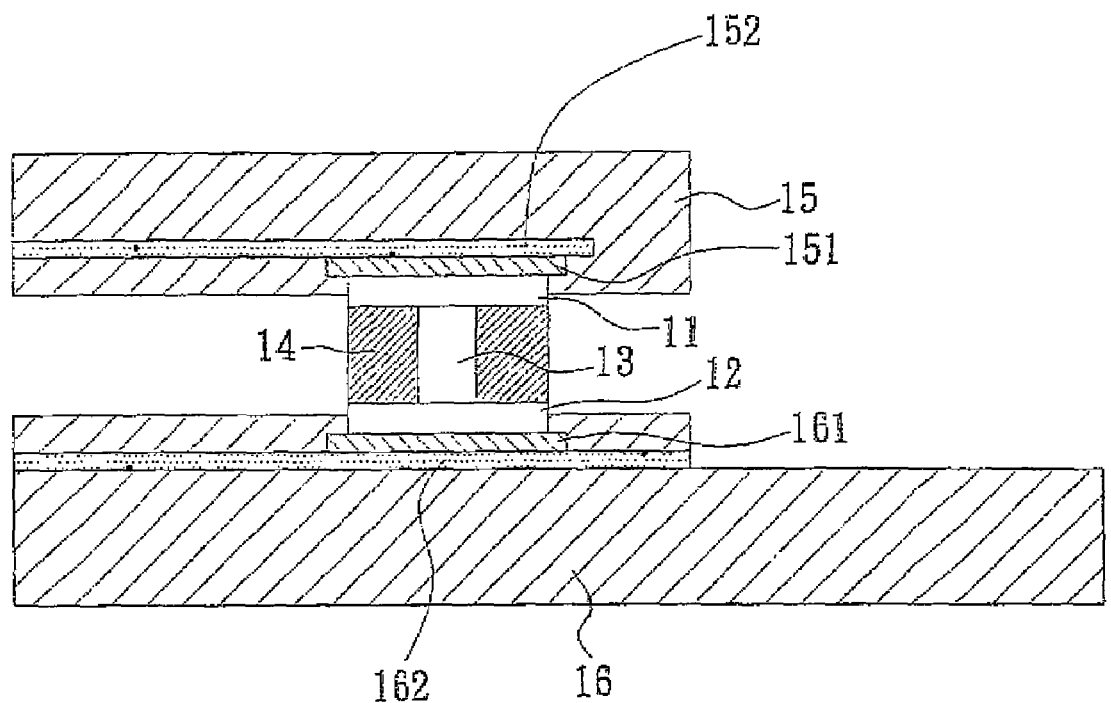
FIG. 2 is a schematic diagram showing an interconnect structure interconnecting an electric device and a substrate according to the present invention.

Please refer to FIG. 2, which is a schematic diagram showing an interconnect structure interconnecting an electric device and a substrate according to the present invention. In FIG. 2, it is obviously that the interconnect structure is arranged between an electronic device 15, i.e. a chip, and a substrate 16 while interconnecting a pad 151 of the chip 15 and a pad 161 of the substrate 16. Moreover, the pad 151 of the chip 15 is connected to the conductor layer 152 while the pad 161 of the substrate 16 is also connected to its conductor layer 162. The interconnect structure is capable of enabling the substrate 16 to electrically connect to the electronic device 15 while buffering and absorbing stresses for protecting the substrate 16 as well as the electronic device 15 from being damaged by external strains.

Figure 3:
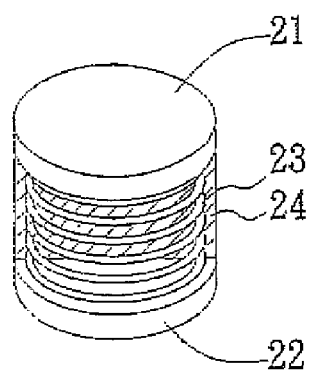
FIG. 3 is a schematic view of an interconnect structure with buffering ability according to a second embodiment of the invention.

Please refer to FIG. 3, which is a schematic view of an interconnect structure with buffering ability according to a second embodiment of the invention. The interconnect structure of the second embodiment also comprises a first surface 21, a second surface 22 and a buffer 24, all constructed similar to those shown in the first embodiment of FIG. 1. The difference between two embodiments is that the supporting part 23 of FIG. 3 is a spring. As the supporting part 23 is a spring that its elastic modulus is different from that of the pillar 13 of FIG. 1, such that the interconnect structure can be designed to adapted to stresses, exerting on the electronic device and the substrate, of different packaging processes, and thus an optimal interconnect structure with buffering ability can be achieved with respect to the stresses exerting on the electronic device and substrate in various packaging processes.

Figure 4:
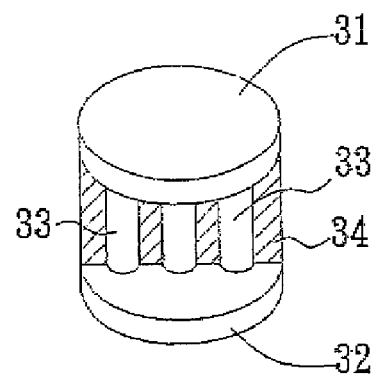
FIG. 4 is a schematic view of an interconnect structure with buffering ability according to a third embodiment of the invention.

Please refer to FIG. 4, which is a schematic view of an interconnect structure with buffering ability according to a third embodiment of the invention. The interconnect structure of the third embodiment also comprises a first surface 31, a second surface 32 and a buffer 34, all constructed similar to those shown in the first embodiment of FIG. 1. The difference between two embodiments is that there are three pillar-like supporting parts 33 with diameter small than that of the pillar 13 of FIG. 1. It is noted that the amount of pillar-like supporting parts 33 capable of being arranged in one individual interconnect structure is not limited by that shown in FIG. 3 that there can be a plurality of pillar-like supporting parts arranged in one individual interconnect structure. As the elastic modulus of the plural supporting parts 23 is different from that of the a single pillar 13 of FIG. 1, such that, by arranging different amount of supporting part in one individual interconnect structure, the interconnect structure can be designed to adapted to stresses, exerting on the electronic device and the substrate, of different packaging processes.

Figure 5:
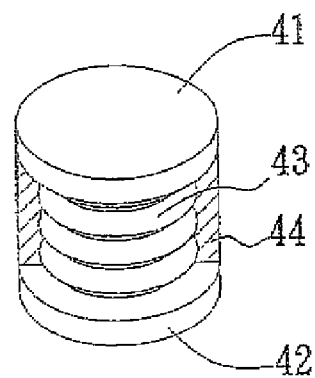
FIG. 5 is a schematic view of an interconnect structure with buffering ability according to a fourth embodiment of the invention.

Please refer to FIG. 5, which is a schematic view of an interconnect structure with buffering ability according to a fourth embodiment of the invention. The interconnect structure of the second embodiment also comprises a first surface 41, a second surface 42 and a buffer 44, all constructed similar to those shown in the first embodiment of FIG. 1. The difference between two embodiments is that the supporting part 43 of FIG. 5 is a spiral. As the supporting part 43 is a spiral that its elastic modulus is different from that of the pillar 13 of FIG. 1, such that the interconnect structure can be designed to adapted to stresses, exerting on the electronic device and the substrate, of different packaging processes, and thus an optimal interconnect structure with buffering ability can be achieved with respect to the stresses exerting on the electronic device and substrate in various packaging processes.

Figure 6A:
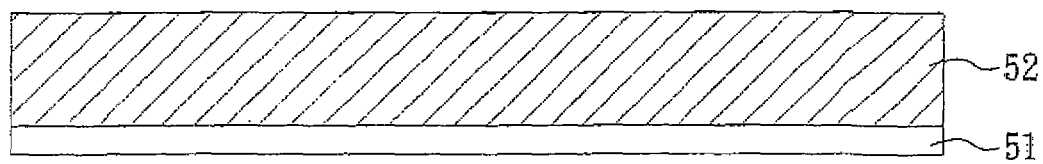
FIG. 6A shows the first step of a method of fabricating an interconnect structure with buffering ability according to a first preferred embodiment of the present invention.
Figure 6B:
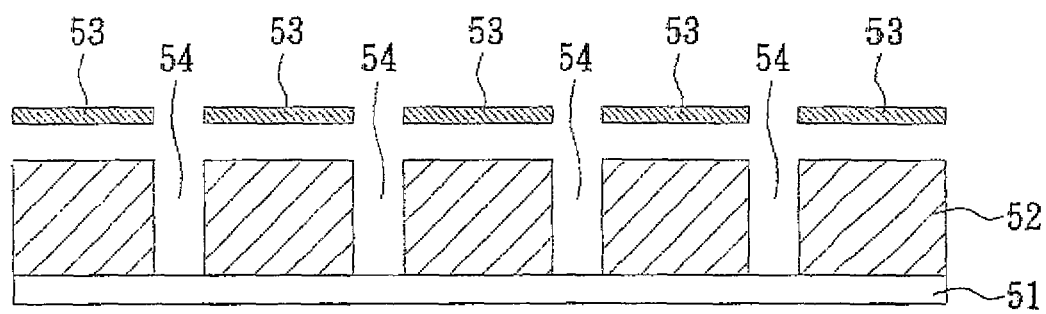
FIG. 6B shows the second step a method of fabricating an interconnect structure with buffering ability according to the first preferred embodiment of the present invention.
Figure 6C:
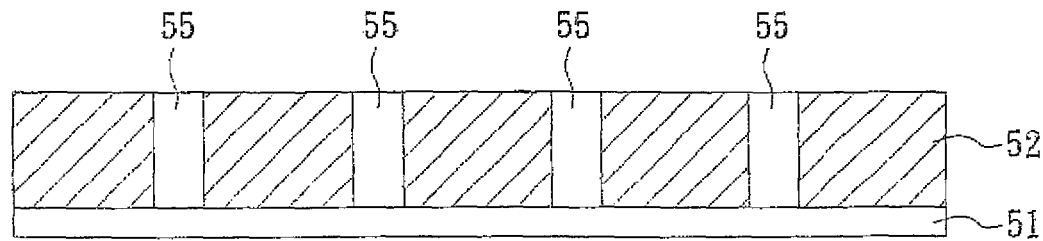
FIG. 6C shows the third step of a method of fabricating an interconnect structure with buffering ability according to the first preferred embodiment of the present invention.
Figure 6D:
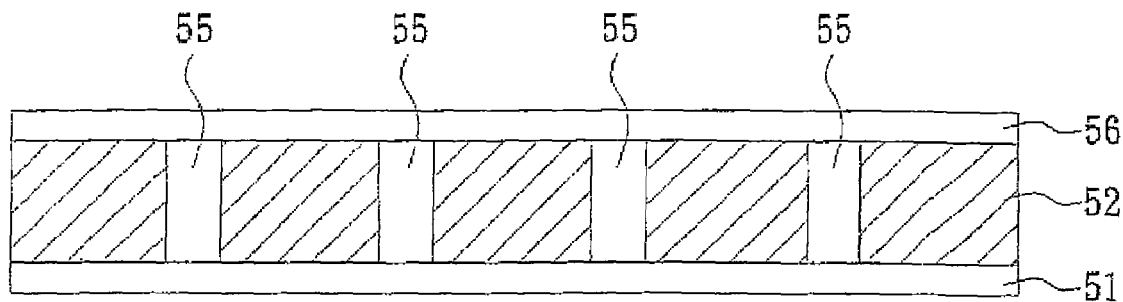
FIG. 6D shows the fourth step of a method of fabricating an interconnect structure with buffering ability according to the first preferred embodiment of the present invention.
Figure 6E:
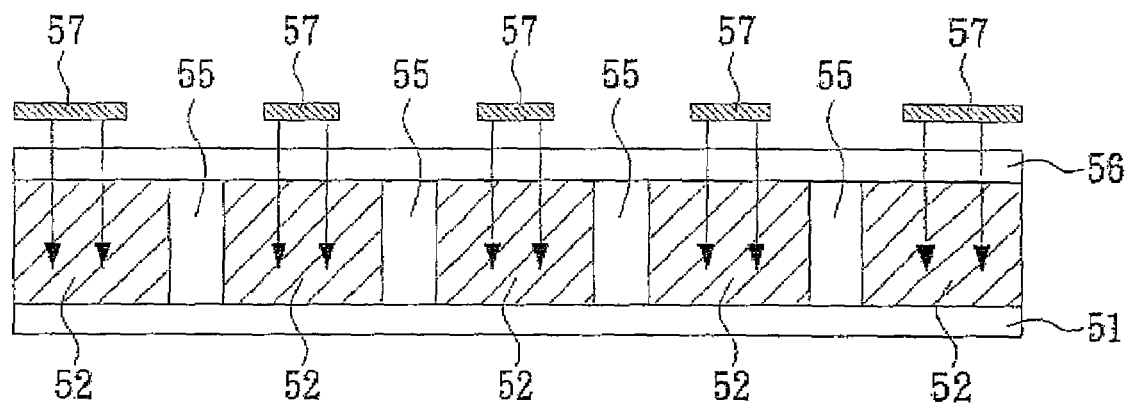
FIG. 6E shows the fifth step of a method of fabricating an interconnect structure with buffering ability according to the first preferred embodiment of the present invention.
Figure 6F:
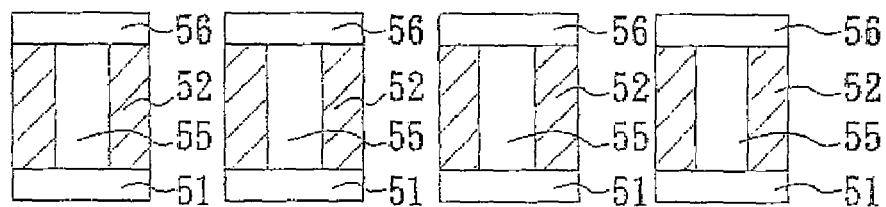
FIG. 6F shows the sixth step of a method of fabricating an interconnect structure with buffering ability according to the first preferred embodiment of the present invention.

Please refer to FIG. 6A to FIG. 6F, which shows steps of a method of fabricating an interconnect structure with buffering ability according to a first preferred embodiment of the present invention. In FIG. 6A, a polyimide (PI) 52 is laminated on top of a metal substrate 51 used as a second surface of an interconnect structure to be formed, whereas the metal substrate is made from a copper foil. In FIG. 6B, the laminated polyimide 52 is etched to form a plurality of etch holes 54 while enabling the plural etch holes to be spaced from each other by a specific interval according to a pattern defined by a plurality of photo mask 53. In FIG. 6C, a plurality of metal pillars 55, acted as supporting parts, can be formed by filling a metal into each etch hole 54 using a means of electroplating while enabling the formed metal pillars to connected to the metal substrate 51 electrically. In FIG. 6D, a flat metal layer 56, acted as the first surface, can be formed on the polyimide 52 and the metal pillars 55 by a means selected from the group consisting of: an over electroplating method and a lamination method, whereas the metal pillars 55, the metal substrate 51 and the metal layer are made of copper so that the first surface, the second surface and the supporting parts are electrically connected to each other. In FIG. 6E, a mechanical pressurized force is used force a plurality of punch heads 57 to punch the structure of the aforesaid steps so as to form a plurality of interconnect structures thereby, as shown in FIG. 6F.

Figure 7A:
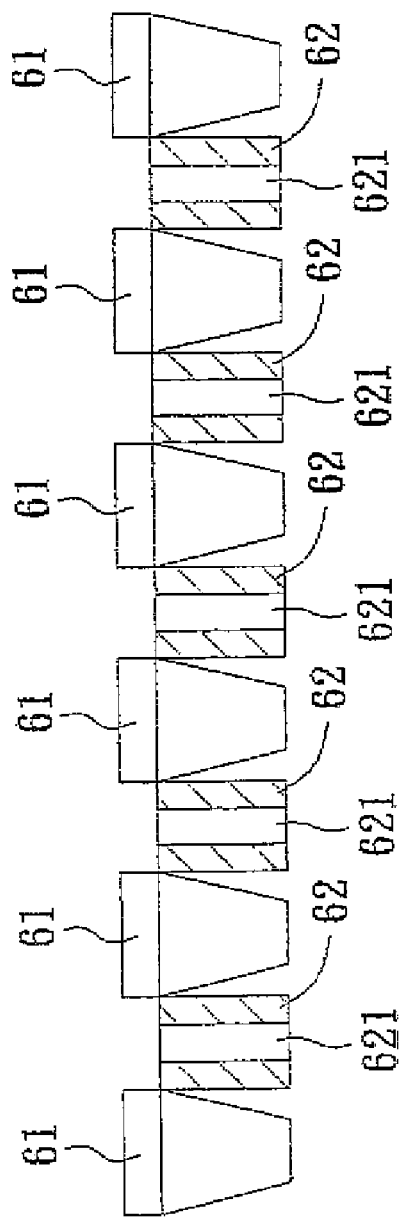
FIG. 7A shows the first step of a method of fabricating an interconnect structure with buffering ability according to a second preferred embodiment of the present invention.
Figure 7B:
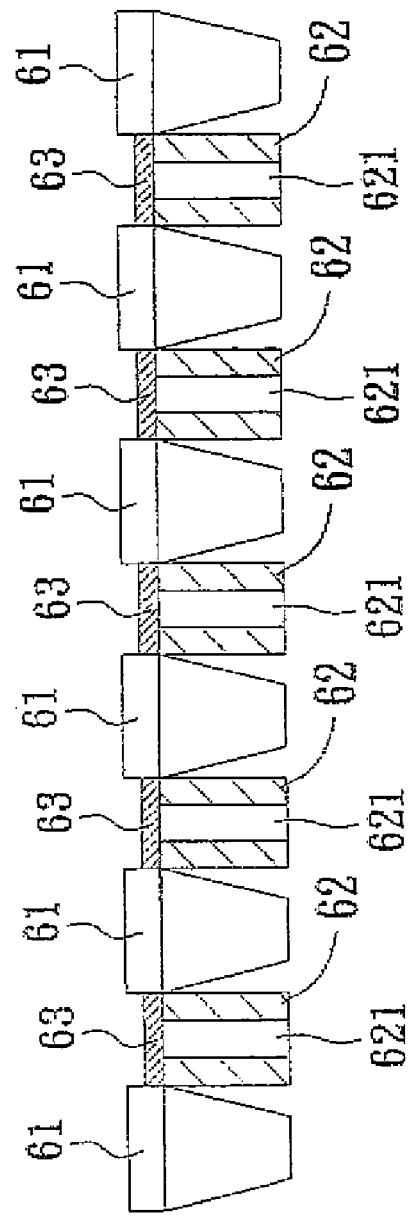
FIG. 7B shows the second step of a method of fabricating an interconnect structure with buffering ability according to the second preferred embodiment of the present invention.
Figure 7C:
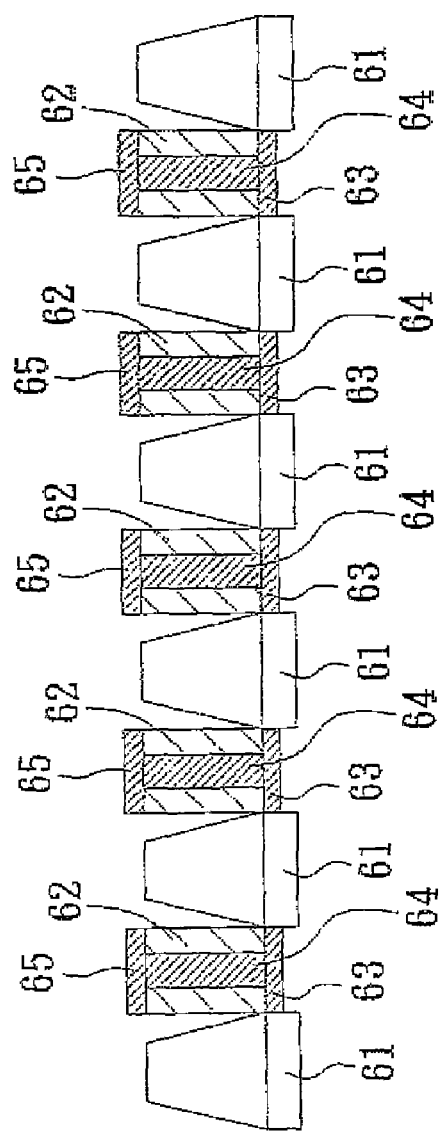
FIG. 7C shows the third step of a method of fabricating an interconnect structure with buffering ability according to the second preferred embodiment of the present invention.
Figure 7D:
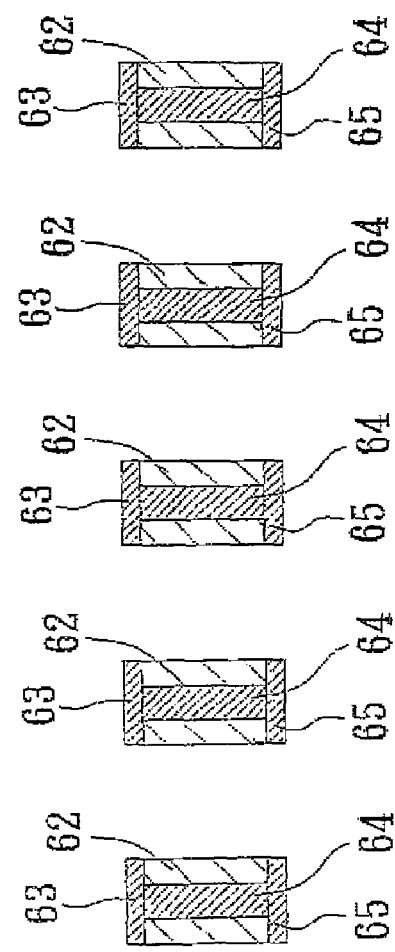
FIG. 7D shows the fourth step of a method of fabricating an interconnect structure with buffering ability according to the second preferred embodiment of the present invention.

Please refer to FIG. 7A to FIG. 7D, which shows steps of a method of fabricating an interconnect structure with buffering ability according to a second preferred embodiment of the present invention. In FIG. 7A, a capillary tube 62 having a through hole 321 channeling therethrough is provided, whereas the capillary tube 62 is made of a low-K polymer, preferably being made of a polyimide (PI). Moreover, each of a plurality of capillary tubes 62, precut to a specific length, is inset into one corresponding via hole of a plural via holes formed in a mold 61. In FIG. 7B, an end of each through hole 621 is sealed by electroplating a metal thereon so as to form a first surface 63 on top of each capillary tube 62, whereas the metal used for sealing the through hole 621 is copper. In FIG. 7C, the mold 61 is inverted for positioning the first surface 63 to the bottom of each capillary tube 62 while forming a supporting part 64 by filling a metal, preferably to be copper, into each through hole 621 using a means of electroplating, and then forming a second surface 65 on top of each capillary tube 63 by over electroplating. In FIG. 7D, the mold 61 is removed so as to form a plurality of interconnect structures, whereas the first surface 63, the second surface 65 and the supporting part 64 are all made of copper according to a preferred aspect.

From the above description, it is noted that, instead of forming a layer of underfill encapsulating the solder bumps interconnecting a chip and a substrate for overcoming cracking caused by the thermal-induced stresses, the interconnect structure with buffering ability of the present invention use a conductive material to fabricate a body, composed of a first surface, a supporting part and a second surface, for enabling electrical interconnection while encapsulating the supporting part with a buffer for absorbing and buffering stresses, so that the chip as well as the substrate can be protected from being damaged by stress. In addition, since the interconnect structure of the invention can be fabricated individually as each interconnect structure is an individual I/O joint, the interconnection of a chip and a substrate can be realized simply by placing and aligning each individual interconnect structure of the invention at its specific position with respect to the orientations of the chip and the substrate. By the use of the interconnect structure of the invention, no underfill or additional stacking process is required for enabling the interconnect structure with stress buffering ability, furthermore, interconnect structure of different elastic modului can be selected to use for meeting the requirement of different packaging processes. It is noted that the elastic modulus of an interconnect structure of the invention can be changed by wrapping the supporting part with buffer made of material of different elastic modulus, or by changing the shape of the supporting part, or even by forming more than one supporting part in one interconnect structure, by which an optimal interconnect structure with buffering ability can be achieved with respect to the stresses exerting on the electronic device and substrate in various packaging processes.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments, which do not depart from the spirit and scope of the invention.

What is claimed is:

1. A method for manufacturing interconnect structures with buffering ability, comprising steps of:
   (a1) disposing a polymer of low-dielectric constant on a metal substrate by a lamination method;
   (b1) etching the polymer to form a plurality of etch holes thereon while enabling the plural etch holes to be spaced from each other by a specific interval;
   (c1) forming a metal pillar by filling up each etch hole with a metal using a means of electroplating while enabling the formed metal pillar to connect to the metal substrate electrically;
   (d1) forming a flat metal layer on the polymer and the metal pillars by a means selected from the group consisting of: an over electroplating method and a lamination method; and
   (e1) using a mechanical pressurized force to punch the structure of the aforesaid steps so as to form a plurality of interconnect structures thereby,
   wherein the step (d1) includes forming the flat metal layer covering an entire top surface of the polymer, and wherein the top surface is farther from the metal substrate than a bottom surface of the polymer.

2. The method of claim 1, wherein the metal of the step (c1) is copper.

3. The method of claim 1, wherein the metal layer of the step (d1) is made of copper.

4. The method of claim 1, wherein the metal substrate of the step (a1) is made of copper.

5. The method of claim 1, wherein the polymer of low-dielectric constant is a polyimide.

6. The method of claim 1, wherein the step (d1) includes forming the flat metal layer further covering an entire top surface of each of the metal pillars.

* * * * *